US010616539B2

(12) United States Patent
Moser et al.

(10) Patent No.: US 10,616,539 B2
(45) Date of Patent: Apr. 7, 2020

(54) DEVICE AND METHOD FOR PRODUCING A LIGHT BEAM

(71) Applicant: FISBA AG, St. Gallen (CH)

(72) Inventors: Hansruedi Moser, Hinterforst (CH); Eberhard Jäger, Krailling (DE)

(73) Assignee: FISBA AG, St. Gallen (CH)

( * ) Notice: Subject to any disclaimer, the term of this patent is extended or adjusted under 35 U.S.C. 154(b) by 0 days.

(21) Appl. No.: 16/087,841

(22) PCT Filed: Feb. 14, 2017

(86) PCT No.: PCT/EP2017/053278
§ 371 (c)(1),
(2) Date: Sep. 24, 2018

(87) PCT Pub. No.: WO2017/167494
PCT Pub. Date: Oct. 5, 2017

(65) Prior Publication Data
US 2019/0132561 A1 May 2, 2019

(30) Foreign Application Priority Data
Mar. 31, 2016 (EP) ...................................... 16163113

(51) Int. Cl.
*G03B 21/20* (2006.01)
*H04N 9/31* (2006.01)
(Continued)

(52) U.S. Cl.
CPC ........... *H04N 9/3152* (2013.01); *G02B 27/10* (2013.01); *G02B 27/106* (2013.01);
(Continued)

(58) Field of Classification Search
CPC ................ H04N 9/3152; G02B 27/106; G03B 21/2033; G03B 33/12; H01S 5/4012
See application file for complete search history.

(56) References Cited

U.S. PATENT DOCUMENTS

| 5,523,889 A | 6/1996 | Bewsher |
| 7,475,993 B2 | 1/2009 | Takeda |
| (Continued) | | |

FOREIGN PATENT DOCUMENTS

| DE | 112011100813 T5 | 12/2012 |
| DE | 10 2013 216 896 A1 | 2/2015 |
| (Continued) | | |

OTHER PUBLICATIONS

International Search Report Corresponding to PCT/EP2017/053278 dated Apr. 28, 2017.
(Continued)

*Primary Examiner* — Cara E Rakowski
*Assistant Examiner* — Magda Cruz
(74) *Attorney, Agent, or Firm* — Davis & Bujold PLLC; Michael J. Bujold

(57) ABSTRACT

Apparatus (1) for generating a light beam via at least first and second light sources (2, 3). During operation, the light sources (2, 3) emitting light at the same wavelength. The light sources are arranged such that the beam profile (11) of the first light source is rotated relative to the beam profile (12) of the second light source by a rotation angle (D) about an axis (A) in the direction of propagation. A beam rotation element (4) is located downstream of at least one of the light sources, which causes the beam profile (11, 12) to rotate such that the beam profile (11, 12), after passing through the beam rotation element (4) in a plane perpendicular to the direction of propagation (A) of the light, is oriented substantially identically to the beam profile of the other light source (2, 3) in the plane perpendicular to the direction of propagation.

16 Claims, 2 Drawing Sheets

Figure 1:
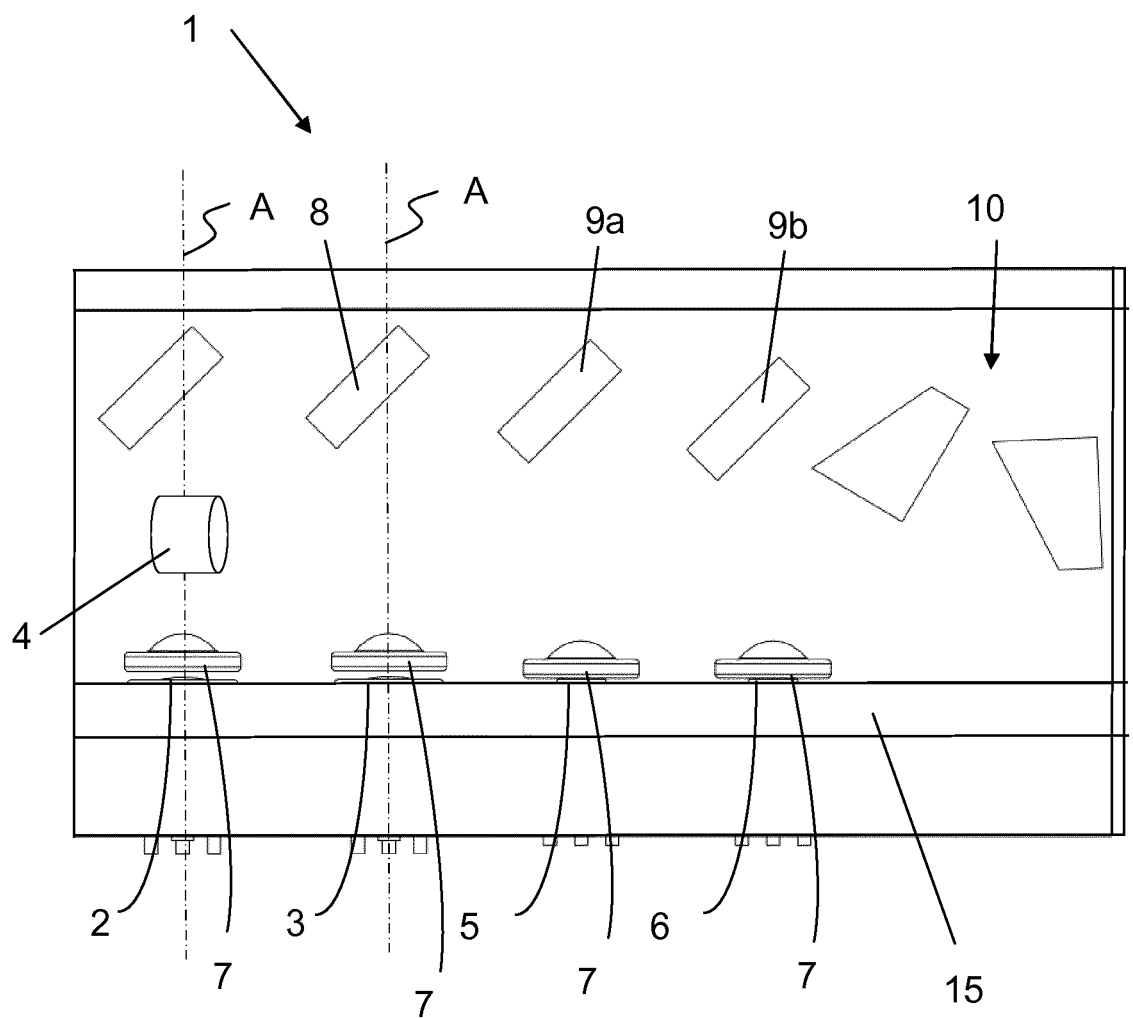

(51) Int. Cl.
  *G02B 27/10* (2006.01)
  *G03B 33/12* (2006.01)
  *H01S 5/40* (2006.01)
(52) U.S. Cl.
  CPC ......... *G03B 21/2033* (2013.01); *G03B 33/12* (2013.01); *H01S 5/4012* (2013.01); *H04N 9/3129* (2013.01)

(56) References Cited

U.S. PATENT DOCUMENTS

| | | | |
|---|---|---|---|
| 8,553,327 | B2 | 10/2013 | Chann et al. |
| 9,448,410 | B2 | 9/2016 | Mikhailov |
| 2006/0238660 | A1 | 10/2006 | Takeda |
| 2011/0205456 | A1* | 8/2011 | Mizoguchi ........... G02B 5/0236 349/5 |
| 2011/0216417 | A1 | 9/2011 | Chann et al. |
| 2011/0242498 | A1* | 10/2011 | Kosaka ................ G02B 27/104 353/33 |
| 2013/0271830 | A1 | 10/2013 | Mikhailov |
| 2013/0321891 | A1* | 12/2013 | Ishida ................ G02B 27/0172 359/212.1 |
| 2014/0185021 | A1* | 7/2014 | Yamagiwa ......... G03B 21/2033 353/99 |
| 2015/0286121 | A1* | 10/2015 | Kilcher ............. G02B 26/0833 353/33 |
| 2016/0211652 | A1 | 7/2016 | Fischer et al. |
| 2017/0153009 | A1* | 6/2017 | Moser .................. H01S 5/4093 |
| 2018/0252929 | A1 | 9/2018 | Tayebati et al. |

FOREIGN PATENT DOCUMENTS

| | | |
|---|---|---|
| JP | 843610 A | 2/1996 |
| JP | 2006323354 A | 11/2006 |
| JP | 2007225989 A | 9/2007 |
| JP | 2013521667 A | 6/2013 |
| JP | 2014505269 A | 2/2014 |
| JP | 2016540252 A | 12/2016 |
| WO | 2015/134842 A1 | 9/2015 |
| WO | 2015134842 A1 | 9/2015 |
| WO | 2015153199 A1 | 10/2015 |
| WO | WO-2016005179 A1 * | 1/2016 ............. G02B 7/025 |

OTHER PUBLICATIONS

Written Opinion Corresponding to PCT/EP2017/053278 dated Apr. 28, 2017.

European Search Report issued in corresponding European Patent Application No. 16163113.0 dated Sep. 23, 2016.

Japanese Office Action issued in corresponding Japanese Patent Application No. 2018551175 dated Feb. 22, 2019.

* cited by examiner

DEVICE AND METHOD FOR PRODUCING A LIGHT BEAM

The invention concerns an apparatus and a method for generating a light beam according to the generic term of the independent claims.

Light modules are already known in which light of different wavelengths is combined in one beam and then directed onto a projection screen.

For example, a projection module is known from DE 10 2013 216896, in which light sources of different wavelengths are each directed to one wavelength-sensitive mirror, e.g. a dielectric or dichroic mirror, whereby the emitted light from the light sources is coupled into a common beam by the mirrors. For example, the combined beam can be guided onto a MEMS mirror, which then directs the light beam onto a projection surface.

Many applications require high power in a collimated beam. Since the power of commercially available diodes is limited, an increase in power is achieved by doubling the number of laser diodes.

In order to superimpose the beams of two light sources with a filter and to double the power, the polarization directions must be perpendicular to each other. The polarization can be rotated with a $\lambda/2$ retarder plate, for example. However, retarder plates are highly sensitive and expensive components.

Alternatively, the light source can be installed in rotated position. However, the light of laser diodes usually has an asymmetrical beam profile. If semiconductor laser light is superimposed with polarizations perpendicular to each other, the half axes of the elliptical beam profile or beam cross-section are also perpendicular to each other, whereby the beam width of the common beam composed from the superimposition of the light of different light sources is increased overall.

DE 10 2013 216896 therefore suggests that the light from a first red light source has a different wavelength than the light from the second red light source. For the superposition of light from the first and second light sources, a dielectric mirror can be used instead of a polarization beam splitter without increasing the beam profile and reducing the resolution capability.

However, the design has the disadvantage that conventional or commercially available diodes cannot be used and that actually light beams with four different wavelength ranges are superimposed. A control of the light sources, as it is common with known RGB modules, cannot be carried out easily.

It is therefore the object of the invention to create an apparatus for generating a light beam and a method for generating a light beam which avoid the disadvantages of the state of the art. In particular, it is the object of the invention to create an apparatus and a method which use simple components and can be provided cost-effectively.

The object is solved by an apparatus for producing a light beam having at least a first and a second light source, wherein the first and the second light source preferably emit light of the same wavelength during operation. According to the invention, the light sources are arranged relative to one another such that the beam profile of the first light source is rotated with respect to the beam profile of the second light source about an axis in the direction of light propagation by a rotation angle, preferably by 90 degrees.

A beam rotation element is arranged downstream of at least one of the light sources which beam rotation element effects a rotation of the beam profile by an angle such that the beam profile of the light source after passing through the beam rotation element is oriented in a plane perpendicular to the direction of propagation of the light, substantially identically to the beam profile of the other light source in the plane perpendicular to the direction of propagation.

In particular, the beam rotation element effects the main axes of the beam profiles being oriented parallel to each other after passing through the beam rotation element.

The light sources are especially laser diodes, which preferably emit red light.

The beam rotation element causes an alignment of the beam profile.

Light sources having asymmetric beam profiles can be oriented relative to each other, nevertheless parallel beam profiles can still be achieved by the beam rotating element.

The beam rotation element does in particular not rotate the polarization of the emitted beam. The beam rotation element therefore offers a possibility to change the beam profile independent from the polarization.

In a preferred version of the invention, the apparatus comprises further light sources, preferably two further light sources, which during operation emit light having wavelengths that are respectively different to the wavelengths of the first and second light sources. In this way, a light module can be made available that can be used, for example, in a pico projector for image display in the visible wavelength range.

The apparatus is preferably designed so that beam guiding elements are provided, in particular in order to combine the light beams generated by different light sources.

The light sources and the at least one beam rotation element are preferably arranged in a way that light beams are combined with equally oriented beam profiles.

Preferably, light sources are provided which emit polarized light, preferably linearly polarized light, during operation. The polarization directions of the first and second light sources are rotated with respect to one another according to the beam profiles and the beam rotation element does not effect the rotation of the.

Typically, the beam profiles of laser diodes differ in the direction of slow and fast axis, resulting in elliptical beam profiles in a plane perpendicular to the direction of propagation of the light. If the light source is rotated about an axis in the direction of propagation, not only the polarization but also the orientation of the beam profile changes.

The beam rotation element enables the creation of beams of the same wavelength and different polarization with the same beam profile. The beams can then be combined, for example, via a pole splitter without increasing the beam profile and reducing the resolution capability.

In an advantageous embodiment of the invention, each light source is assigned a collimating lens for collimating a light beam emerging from the light source.

Advantageously, the beam guiding elements comprise a pole splitter. With the pole splitter, light beams of the same wavelength but of different polarization can be combined. The pole splitter reflects light with a certain polarization direction and is transparent to light that is polarized in other directions.

Advantageously, the beam guiding elements comprise a wavelength-sensitive mirror, for example a dichroic mirror. For example, the mirror is reflective for certain wavelengths and transmissive for other wavelengths. By means of such filters, beams with further wavelengths can be coupled into a light beam with certain wavelengths.

The apparatus preferably comprises a pole splitter and dichroic mirrors, so that light beams of the same wavelengths can be combined and light beams with further wavelengths can be coupled into these combined light beams. Thus, a light beam with red, green and blue wavelength components can be obtained, wherein the red components are fed by several light sources.

In an advantageous embodiment, the beam guiding elements comprise a prism telescope. The prism telescope is used for reshaping the beam cross-section, wherein for example a laser beam having an elliptical cross-section, which typically exits from a collimating device, is transformed by a pair of prisms into a beam having a circular cross-section.

Preferably, a combined light beam is guided through the prism telescope.

A cylinder telescope can be provided as the beam rotation element. This is preferably arranged such that the cylinder axis of which divides the rotation angle between the light sources.

The angle of rotation between two light sources is the angle by which one light source is rotated relative to the direction of propagation of the light with respect to another light source. For light sources having the same beam pattern that have an elliptical beam profile, the angle of rotation describes the angle between the main axes of the respective ellipses. For light sources emitting polarized light, the angle of rotation describes the angle between the respective main polarization directions, for example the angle between the respective fast and slow axes.

If the cylinder telescope is arranged in such a way that the cylinder axis divides the rotation angle by half, the beam profile is rotated back by the angle of rotation.

In particular, the cylinder axis is inclined by 45 degrees with respect to a main axis of the beam profile of the light source.

In the case of two light sources, one of which is rotated 90 degrees about the axis of the direction of propagation relative to the other light source in order to generate two light beams with polarization perpendicular to each other, for example, a cylinder telescope arranged in this path can bring the beam profiles back into parallel orientation, wherein the polarization remains unaffected.

The light sources can be arranged in one plane, preferably next to each other, preferably having an approximately parallel light propagation direction. The light sources can then be arranged on a common carrier, which facilitates subsequent installation. Each light source is assigned a corresponding mirror for merging the light beams, which can also be arranged next to each other.

The object underlying the invention is further solved by a method for generating a light beam in which at least two light sources emit light, preferably having the same wavelength. The beam profile of the light beam emitted by the first light source is rotated by with respect to the beam profile of the light beam that is emitted by the second light source a rotation angle, preferably 90 degrees. At least one of the light beams is guided through a beam rotation element. The beam profile of the light beam is rotated by an angle such that the beam profile of the light source after passing through the beam rotation element is oriented in a plane perpendicular to the direction of propagation of the light substantially identically to the beam profile of the other light source in the plane perpendicular to the direction of propagation.

In particular, the directions of the main axes of the beam profiles are parallel with respect to each other after one light beam has passed through the beam rotation element.

In a preferential further development, further, preferably two, light sources emit light the wavelengths of which in each case differ from the wavelengths of the first and second light source.

Light from four light sources in a total of three different wavelength ranges is particularly preferred.

Preferably, the light sources each emit polarized light, preferably linearly polarized light. The polarization directions of the first and second light sources are rotated with respect to each other according to the beam profiles. The beam rotation element only rotates the beam profiles and does not effect the rotation of the polarization.

Advantageously, the beams are combined by beam guiding elements to form a combined beam. The beam guiding elements comprise in particular a pole splitter, a wavelength-sensitive mirror, for example a dichroic mirror.

The beams can be guided through a prism telescope. There the beam profile is changed, e.g. an elliptical beam profile is converted into a circular beam profile.

Preferably, the light beams are each collimated with a collimating lens.

Figure 2A:
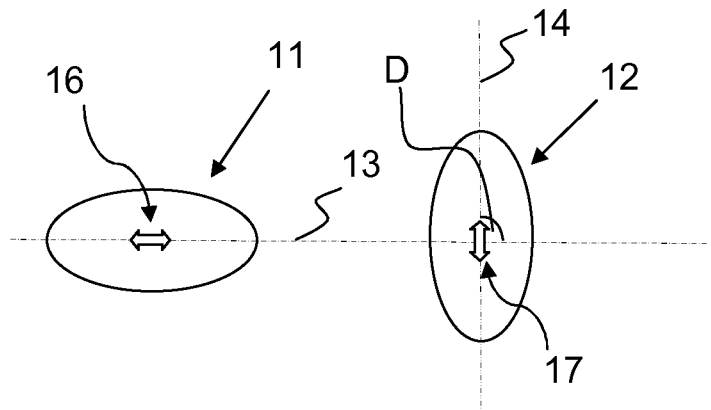
Figure 2B:
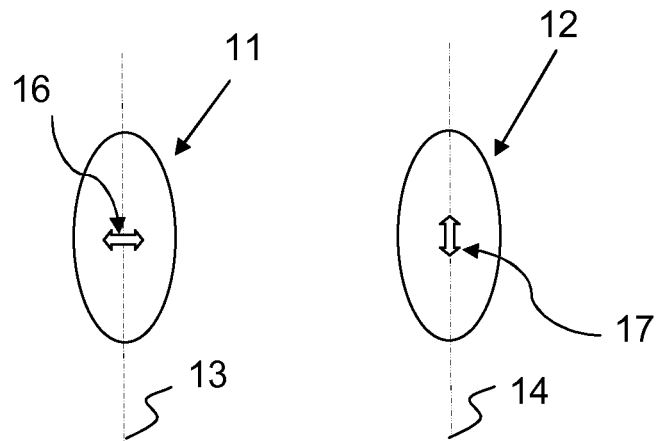

The invention is explained in more detail in the following embodiments. It shows FIG. 1 a schematic view of an apparatus according to the invention in plan view;

FIG. 2a a schematic view of the beam profiles of two light sources prior to passing through the beam rotation element;

FIG. 2b a schematic view of the beam profiles of two light sources after passing through the beam rotation element.

FIG. 1 shows a schematic view of an apparatus 1 according to the invention in plan view.

The apparatus comprises a first light source 2 and a second light source 3, being in the form of laser diodes, the first and second light sources 2, 3 emitting light of the same wavelength in operation, in this case light in the red wavelength range.

The light sources 2, 3 are arranged in such a way relative to each other that the beam profile of the first light source 2 is rotated relative to the beam profile of the second light source 3 by a rotation angle D, preferably by 90 degrees, about an axis A in the direction of light propagation.

Downstream of the first light source 2 a beam rotation element (e.g., a cylinder telescope) 4 is arranged, which causes the beam profile of the first light source to rotate by an angle −D.

The apparatus 1 comprises two further light sources 5, 6, which in operation emit light having wavelengths which are different from the wavelengths of the first and second light sources 2, 3. The other light sources 5, 6 emit light in the green and blue wavelength range.

Each light source 2, 3, 5, 6 is assigned a collimating lens 7 for collimating a light beam emerging from light source 2, 3, 5, 6.

The apparatus comprises beam guiding elements 8, 9a, 9b for merging the light beams. A beam guiding element is designed as pole splitter 8. The pole splitter combines light beams of the same wavelength but of different polarisation.

Two beam guiding elements are designed as dichroic mirrors 9a, 9b. They are reflective for a certain wavelength range and pass through the other wavelengths. The dichroic mirrors 9a, 9b combine light beams of different wavelengths.

The apparatus also includes a prism telescope 10, which converts the elliptical beam cross-section of the merged light beam into a circular beam cross-section.

The light sources are arranged on a diode carrier 15 in a common plane.

FIG. 2a shows a schematic view of the beam profiles 11, 12 of two light sources prior to passing through the beam rotation element 4, FIG. 2b shows the beam profiles after passing through the beam rotation element 4.

The first light source 2 is rotated about the axis A in the direction of propagation of the light by an angle of rotation D, in this case 90 degrees. Thus, not only the main polarization directions 16, 17 of the light sources are arranged at an angle of 90 degrees relative to each other, but also the orientations of the beam profiles 11, 12. In this case, the beam profiles 11, 12 have an elliptical shape, so that the orientations 13, 14 of the long main axes of the ellipse profiles 11, 12 are arranged at the rotation angle D relative to each other.

After passing through the beam rotation element 4, the beam profile 11 of the first light source 2 in a plane perpendicular to the direction of propagation A of the light is oriented essentially identical to the beam profile 12 of the second light source 3 in the plane perpendicular to the direction of propagation.

The orientations 13, 14 of the long main axes of the beam profiles 11, 12 are parallel to each other. At the same time, the main polarization direction 16 of the first light source is still perpendicular to the main polarization direction 17 of the second light source. The light beams can therefore be combined with a pole splitter to form a light beam, wherein the beam profile is retained and not increased.

The invention claimed is:

1. An apparatus for generating a light beam having at least a first and a second light source, the first and the second light sources each comprising a beam profile which differs in a direction of a slow axis and a fast axis, resulting in an elliptical beam profile in a plane perpendicular to a direction of propagation of the light, wherein the first and the second light sources emit light of the same wavelength during operation,
wherein the light sources are arranged relative to one another such that the beam profile of the first light source includes a rotation angle with the beam profile of the second light source, wherein the rotation angle describes an angle between the main axes of the respective ellipses after leaving the respective light sources, and a beam rotation element is arranged downstream of at least one of the light sources which beam rotation element effects a rotation of the beam profile around an axis in the direction of propagation of the light by an angle such that the beam profile of the light source, after passing through the beam rotation element, is oriented in a plane perpendicular to the propagation direction of the light substantially identically to the beam profile of the other light source in the plane perpendicular to the propagation direction, such that the directions of the main axes of the beam profiles are parallel with respect to one another.

2. The apparatus according to claim 1, wherein the apparatus comprises further light sources, which during operation emit light having wavelengths that are respectively different to the wavelengths of the first and second light sources.

3. The apparatus according to claim 1, wherein beam guiding elements are provided.

4. The apparatus according to claim 3, wherein the beam guiding elements comprise a pole splitter.

5. The apparatus according to claim 3, wherein the beam guiding elements comprise dichroic mirrors.

6. The apparatus according to claim 3, wherein the beam guiding elements comprise a prism telescope.

7. The apparatus according to claim 1, wherein light sources are provided, which during operation emit in each case polarized light, wherein the polarization directions of the first and second light sources are rotated with respect to one another according to the beam profiles, and the beam rotation element does not effect the rotation of the polarization.

8. The apparatus according to claim 1, wherein each light source is assigned a collimating lens for collimating a light beam which emerges from the light source.

9. The apparatus according to claim 1, wherein the the beam rotation element is a cylinder telescope which is arranged such that a cylinder axis of which divides the rotation angle between the light sources, such that the cylinder axis is inclined with respect to a main axis of the beam profile of the light source.

10. The apparatus according to claim 1, wherein the light sources are arranged in a plane.

11. A method for generating a light beam, wherein at least two light sources emit light, the first and second light source comprising beam profiles which differ in the direction of slow and fast axis, resulting in elliptical beam profiles in a plane perpendicular to the respective direction of propagation of the light, wherein the beam profile of the light beam emitted by the first light source includes a rotation angle with the beam profile of the light beam that is emitted by the second light source, wherein the rotation angle describes an angle between the main axes of the respective ellipses after leaving the respective light sources, and at least one of the light beams is guided through a beam rotation element, wherein the beam profile of the light beam is rotated by an angle around an axis in the direction of propagation of the light such that the beam profile of the light source, after passing through the beam rotation element, is oriented in a plane perpendicular to the propagation direction of the light substantially identically to the beam profile of the other light source in the plane perpendicular to the propagation direction.

12. The method according to claim 11, wherein further light sources emit light, the wavelengths of which in each case differ from the wavelengths of the first and second light sources.

13. The method according to claim 11, wherein the light sources each emit polarized light, wherein the polarization directions of the first and second light sources are rotated with respect to one another according to the beam profiles, and the beam rotation element does not effect the rotation of the polarization.

14. The method according to claim 11, wherein the beams are combined by beam guiding elements to form a combined beam.

15. The method according to claim 14, wherein the beam guiding elements comprise at least one of a pole splitter, a dichroic mirror and a prism telescope.

16. The method according to claim 11, wherein the light beams are each collimated with a collimating lens.

* * * * *